(12) United States Patent
Drake et al.

(10) Patent No.: US 9,000,822 B2
(45) Date of Patent: Apr. 7, 2015

(54) PROGRAMMABLE DELAY CIRCUIT

(71) Applicant: International Business Machines Corporation, Armonk, NY (US)

(72) Inventors: Alan J. Drake, Grapevine, TX (US); Pawel Owczarczyk, Highland, NY (US); Marshall D. Tiner, Elgin, TX (US); Xiaobin Yuan, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/859,544

(22) Filed: Apr. 9, 2013

(65) Prior Publication Data

US 2014/0300398 A1    Oct. 9, 2014

(51) Int. Cl.
*H03H 11/26* (2006.01)
*H03K 5/13* (2014.01)

(52) U.S. Cl.
CPC ..................... *H03K 5/133* (2013.01)

(58) Field of Classification Search
USPC ................................. 327/276, 278
See application file for complete search history.

(56) References Cited

U.S. PATENT DOCUMENTS

| | | | |
|---|---|---|---|
| 5,506,534 A | 4/1996 | Cuo et al. | |
| 5,598,348 A | 1/1997 | Rusu et al. | |
| 5,648,910 A | 7/1997 | Ito | |
| 5,987,086 A | 11/1999 | Raman et al. | |
| 6,305,000 B1 | 10/2001 | Phan et al. | |
| 6,311,147 B1 | 10/2001 | Tuan et al. | |
| 6,411,150 B1 | 6/2002 | Williams | |
| 6,417,705 B1 | 7/2002 | Tursi et al. | |
| 6,446,245 B1 | 9/2002 | Xing et al. | |
| 6,480,989 B2 | 11/2002 | Chan et al. | |
| 6,523,154 B2 | 2/2003 | Cohn et al. | |
| 6,598,206 B2 | 7/2003 | Darden et al. | |
| 6,609,242 B1 | 8/2003 | Slade | |
| 6,621,303 B2 | 9/2003 | Moon | |
| 6,675,139 B1 | 1/2004 | Jetton et al. | |
| 6,701,509 B2 | 3/2004 | Aggarwal et al. | |
| 6,721,936 B2 | 4/2004 | Bobba et al. | |
| 6,725,439 B1 | 4/2004 | Homsinger et al. | |
| 6,823,501 B1 | 11/2004 | Dahl | |
| 6,825,732 B2 | 11/2004 | Motoyama | |
| 6,976,235 B2 | 12/2005 | Bobba et al. | |
| 7,086,024 B2 | 8/2006 | Hsu et al. | |
| 7,197,736 B2 | 3/2007 | Saxena et al. | |
| 7,411,434 B2 | 8/2008 | Carley et al. | |
| 7,428,286 B2 | 9/2008 | Kim | |
| 7,511,547 B2 | 3/2009 | Suda et al. | |

(Continued)

OTHER PUBLICATIONS

Bruno W. Garlepp, et al.: "A Portable Digital Dll for High-Speed CMOS Interface Circuits"; IEEE Journal of Solid-state Circuits— IEEE J Solid-State Circuits , vol. 34, No. 5, 1 page, 1999.

(Continued)

*Primary Examiner* — Daniel Rojas
(74) *Attorney, Agent, or Firm* — Cantor Colburn LLP; Margaret McNamara

(57) ABSTRACT

A delay circuit includes at least one main inverter configured to receive an input signal and output a delayed output signal and at least one switchable inverter connected in parallel with the main inverter circuit. The switchable inverter is configured to decrease a delay between the input signal and the delayed output signal based on the switchable inverter being turned on.

9 Claims, 3 Drawing Sheets

(56) References Cited

U.S. PATENT DOCUMENTS

| | | |
|---|---|---|
| 7,530,035 B2 | 5/2009 | Wang |
| 7,784,010 B1 | 8/2010 | Balsdon et al. |
| 7,797,654 B2 | 9/2010 | Tai et al. |
| 7,808,328 B2 | 10/2010 | Tatschl-Unterberger et al. |
| 7,969,014 B2 | 6/2011 | Chuang |
| 7,989,849 B2 | 8/2011 | Sherlekar et al. |
| 8,022,849 B2 | 9/2011 | Zhang et al. |
| 8,037,431 B2 * | 10/2011 | Boerstler et al. .............. 716/100 |
| 2005/0242439 A1 | 11/2005 | DeVries et al. |
| 2006/0239102 A1 | 10/2006 | Saita et al. |
| 2008/0066026 A1 | 3/2008 | Tai et al. |
| 2011/0113398 A1 | 5/2011 | Keinert et al. |
| 2011/0304052 A1 | 12/2011 | Turner et al. |
| 2012/0242149 A1 | 9/2012 | Chuang et al. |
| 2012/0313683 A1 | 12/2012 | Rylov |

OTHER PUBLICATIONS

David C. Keezer, et al.; "Variable Delay of Multi-Gigahertz Digital Signals for Deskew and Jitter-Injection Test Applications"; 1 page, 2008.

IBM, "Temporarily use multiple power rails for increased integrator flexibility", IPCOM000124405D, Apr. 19, 2005, pp. 1-6.

Ng, Charles H., "A "Gridless" Variable-Width Channel Router for Macro Cell Design", 24th ACM/IEEE Design Automation Conference, 1987, pp. 633-636.

\* cited by examiner

PROGRAMMABLE DELAY CIRCUIT

BACKGROUND

This invention relates generally to delay circuits and in particular to a programmable delay circuit.

Delay circuits are used in computer systems and other digital circuitry to adjust timing signals for purposes of synchronization of different timing signals or data signals. Delay circuits may be analog delay circuits in which analog signals control the activation of delay elements, such as current-starved inverters, or digital delay circuits in which digital signals control delay elements. Conventional delay circuits include switchable delay steps that allow users or systems to adjust a delay output by the delay circuit. However, conventional delay circuits suffer from non-uniform delay steps. Engaging one step adjusts the delay by one value and engaging the next step adjusts the delay by another value that is not the same as the first value, resulting in non-linear and non-uniform delay changes.

BRIEF SUMMARY

Embodiments include a delay circuit including at least one main inverter configured to receive an input signal and output a delayed output signal at least one switchable inverter connected in parallel with the at least one main inverter circuit. The switchable inverter is configured to decrease a delay between the input signal and the delayed output signal based on the switchable inverter being turned on.

A computing circuit includes clocked circuitry configured to receive data and perform data manipulation on the data based on a first clock signal, a controller configured to control the transmission of the data to the clocked circuitry and a clock generator. The clock generator is configured to receive as inputs a second clock signal and a delay control signal from the controller, and the clock generator is configured to delay the second clock signal to generate the first clock signal. The clock generator includes a main delay component configured to receive the second clock signal and output the first clock signal and a switchable delay component connected in parallel with the main delay component. The switchable delay component is configured to receive as an input the delay control signal from the controller.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

Referring now to the drawings wherein like elements are numbered alike in the several figures.

DETAILED DESCRIPTION

Conventional analog and digital signal delay circuits suffer from non-uniform delay adjustment from one delay step to the next. Embodiments of the invention relate to delay circuits having switchable delay components connected in parallel with main delay components to provide a uniform delay change with the activation of different delay stages.

Figure 1:
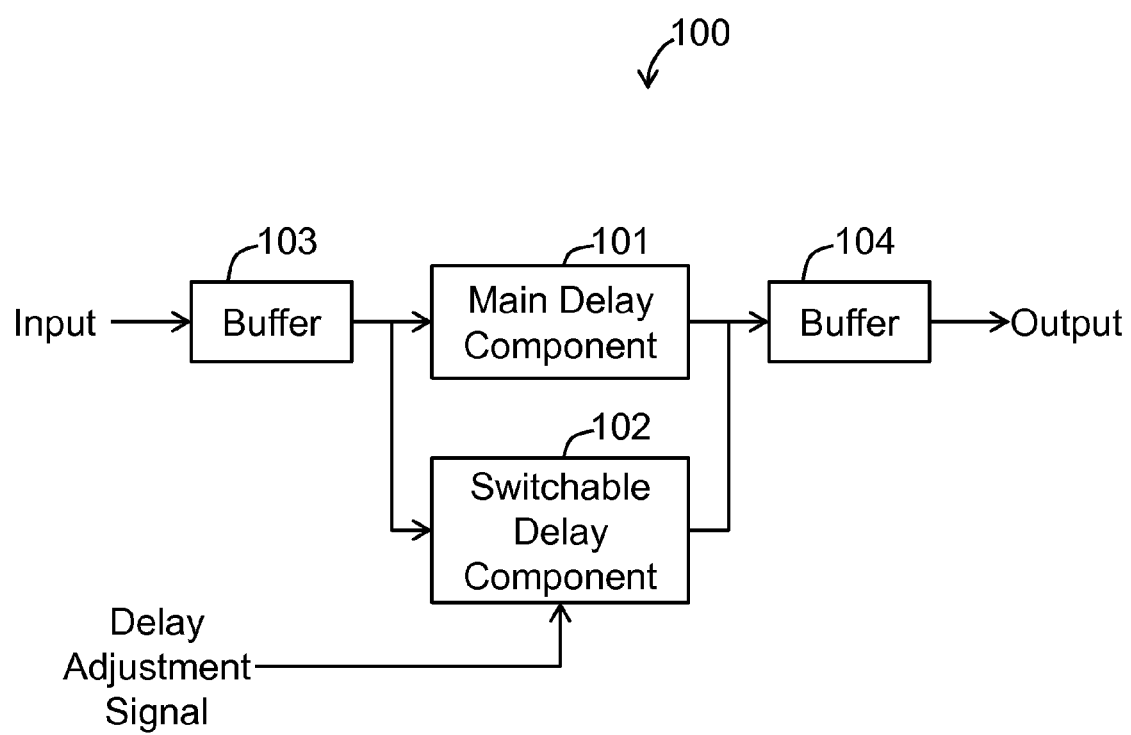
FIG. 1 illustrates a block diagram of a delay circuit according to an embodiment of the invention.

FIG. 1 illustrates a delay circuit 100 according to an embodiment of the invention. The delay circuit 100 includes a main delay component 101 and a switchable delay component 102. The delay circuit 100 includes an input buffer 103 and an output buffer 104. An input signal is input to the input buffer 103, and an output from the input buffer 103 is input to the main delay component 101. The main delay component 101 delays the input signal to generate a delayed output signal, which is provided to the output buffer 104. The switchable delay component 102 is connected in parallel with the main delay component 101. The switchable delay component 102 is controlled by a delay adjustment signal. In one embodiment, the delay applied to the input signal is decreased when the switchable delay component 102 is turned on, and increased when the switchable delay component 102 is turned off. Accordingly, the delay circuit 100 is capable of providing at least two delays to an input signal based on the state of the delay adjustment signal.

In embodiments of the invention, the main delay component 101 may be larger or smaller than the switchable delay component 102 based on the desired delay step. For example, if a fine delay step below one inverter delay is needed, the main delay component 101 may be at least five times or at least ten times larger than the switchable delay component 102, where "larger" refers to higher driving strength or larger widths of the transistors in the main delay component 101. In operation, turning on the switchable delay component 102 adds more driving current to the circuit and hence reduces the overall delay.

While FIG. 1 illustrates a delay circuit 100 including buffers 103 and 104, embodiments of the invention encompass circuits in which one or both of the buffers 103 and 104 are omitted. In embodiments of the invention, the main delay component 101, the switchable delay component 102 and the buffers 103 and 104 may be made up of inverters, and the inverters may be made up of transistors.

Figure 2:
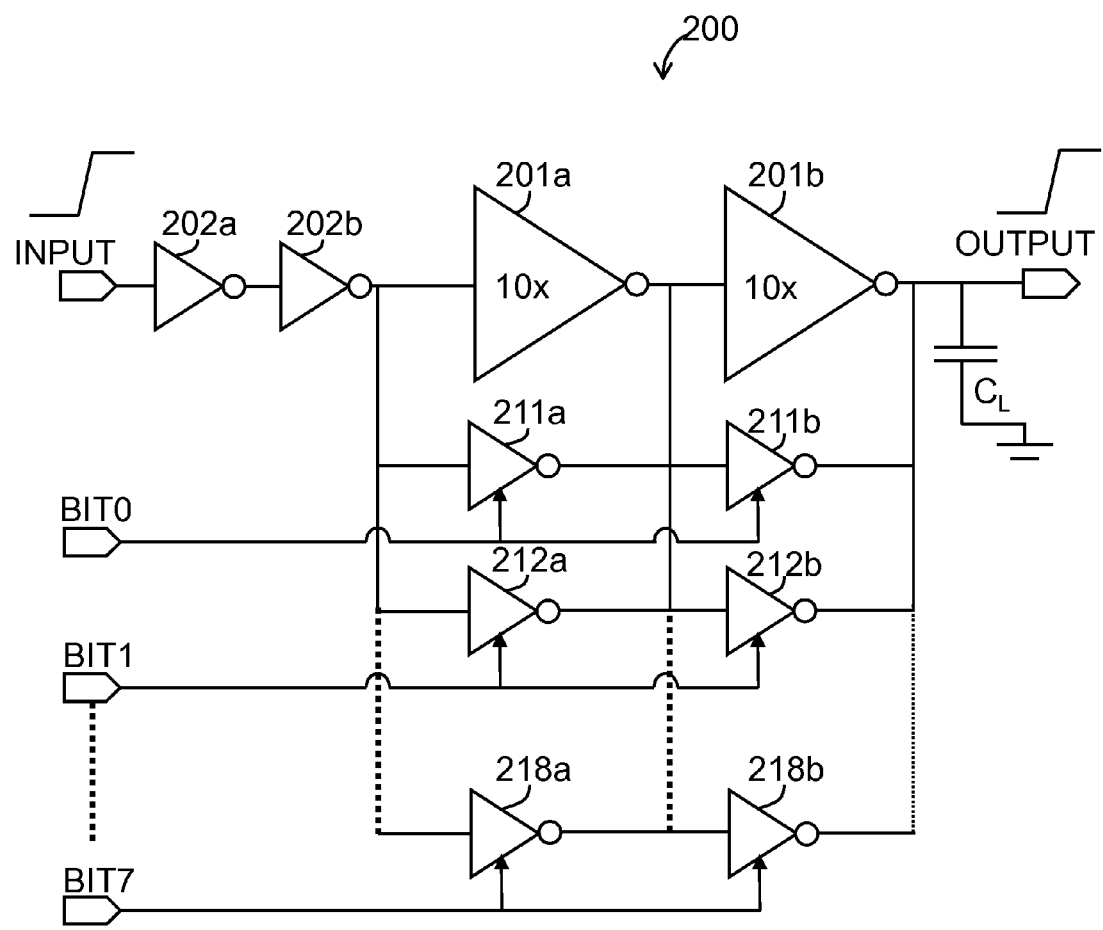
FIG. 2 is a circuit diagram of a delay circuit according to an embodiment of the invention.

FIG. 2 illustrates a circuit diagram of a delay circuit 200 according to an embodiment of the invention. The delay circuit 200 includes main inverters 201a and 201b that generate a main delay in an input signal and switchable inverters 211a, 211b, 212a, 212b, . . . , 218a and 218b that are turned on or off to change a length of the delay. In FIG. 2, the dashed lines represent additional switchable inverters and control bits. The main inverters 201a and 201b correspond to the main delay component 101 of FIG. 1 and the switchable inverters 211a, 211b, 212a, 212b, . . . , 218a and 218b correspond to the switchable delay component 102 of FIG. 1. In one embodiment, each switchable inverter 211a, 211b, 212a, 212b, . . . , 218a and 218b is a tri-state inverter made up of four field effect transistors (FETs), two nFETs and two pFETs. One nFET and one pFET are used to invert the signal. Another nFET and pFET are used to control the on/off of the switchable inverter by its control bit. The widths of the FETs in 211a/211b, 212a/212b, . . . , 218a/218b are different in order to achieve uniform delay steps. The widths correspond to drive current, such that FETs of different widths pass different drive currents. Accordingly, in FIG. 2, each control bit BIT0 to BIT7 controls the on/off state of two switchable inverters.

The delay circuit 200 includes inverters 202a and 202b that form a buffer, corresponding to the buffer 103 of FIG. 1. Embodiments of the invention encompass delay circuits having buffers at only one of the input or the output of the delay circuit, at both the input and the output, or at neither the input nor the output. FIG. 1 also includes a capacitor $C_L$ connected to the output line representing the capacitive load the circuit is driving. Control bits BIT0 to BIT7 control the on/off states of the inverters 211a and 211b to 218a and 218b.

In operation, an input signal is provided to the buffer made up of inverters 202a and 202b. The input signal is provided to the main inverters 201a and 201b, which provide a predetermined delay to the input signal to generate an output signal. The control bits BIT0 to BIT7 are turned on or off to control the on/off states of the switchable inverters 211a and 211b to 218a and 218b. When a set of switchable inverters, such as switchable inverters 211a and 211b is turned on, the current capacity between the input and the output of the delay circuit 200 increases, which results in a decreased delay between the input signal and the output signal. Accordingly, BIT0 alone is turned on to decrease the delay of the input signal, or the delay applied to the output signal, by a first amount. BIT1 is turned on to decrease the delay by about the same amount, and as each bit BIT0 to BIT7 is turned on, the delay is reduced in a substantially linear manner with the turning on of each bit.

In embodiments of the invention, the main inverters 201a and 201b are larger or smaller than the switchable inverters 211a and 211b to 218a and 218b based on the desired delay step. In one embodiment, the main inverters 201a and 201b are at least ten times as large as the switchable inverters 211a and 211b to 218a and 218b in order to achieve fine delay steps.

While FIG. 2 illustrates eight control bits BIT0 to BIT7 and eight corresponding sets of switchable delay components 211a and 211b to 218a and 218b, embodiments of the invention encompass any number of switchable delay components, from as few as one delay component to any number based on the design considerations, such as circuit real estate, desired delay adjustment sensitivity, size of the main inverters 201a and 201b, or any other circuit design consideration. Similarly, any number of main inverters may be provided, from as few as one to as many as design considerations allow. While FIG. 2 illustrates an even number of main inverters 201a and 201b, as well as an even number of switchable delay components 211a and 211b to 218a to 218b in set of delay components connected in parallel with the main inverters 201a and 201b, embodiments of the invention encompass both an even number of main inverters and corresponding delay components and an odd number of main inverters and corresponding delay components. When an even number of main inverters and corresponding delay components is provided, the output signal is not inverted with respect to the input signal, and the rising and falling edges of the output signal are balanced.

Figure 3:
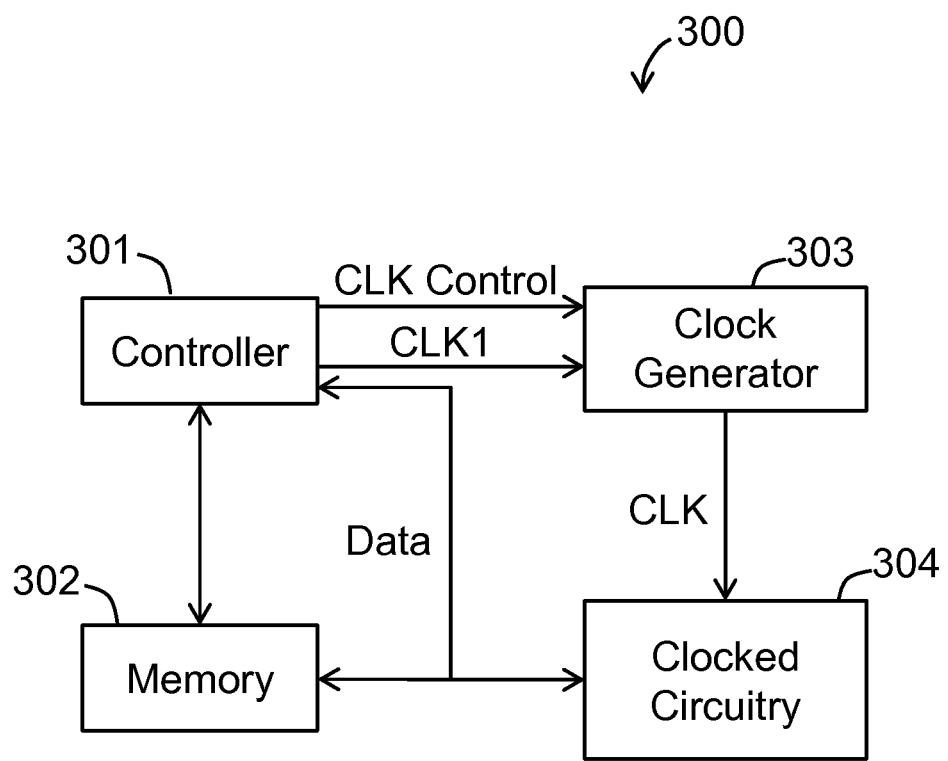
FIG. 3 illustrates a computing circuit including a delay circuit according to an embodiment of the invention.

FIG. 3 illustrates a computing circuit 300 according to an embodiment of the invention. The computing circuit 300 includes a controller 301, memory 302, clock generator 303 and clocked circuitry 304. The controller 301 includes a processor and may further include memory and supporting logic circuits. The controller 301 is configured to receive program data, operand data or any other data from memory to process the data to control processes of the computing circuit 300. The controller 301 is also configured to transmit data from memory to the clocked circuitry 304.

The clocked circuitry 304 includes any type of circuitry including control logic circuitry, memory, latches or any other digital circuitry. The clock generator 303 receives a clock control signal (CLK control) and a preliminary clock signal CLK1 from the controller 301, delays the preliminary clock signal based on the clock control signal (CLK control) and outputs a delayed clock signal CLK to the clocked circuitry 304. In one embodiment, the clock generator 303 includes a structure corresponding to the delay circuit of FIG. 1 or FIG. 2. The preliminary clock signal CLK1 may be generated by any frequency-generating circuit or oscillation circuit or device. While FIG. 3 illustrates the preliminary clock signal CLK1 as originating in the controller 301, embodiments of the invention encompass generation of the preliminary clock signal CLK1 from inside the clock generator 303, or from a device external to each of the controller 301 and clock generator 303.

While an example of a circuit implementing a delay circuit 100 or 200 has been illustrated in FIG. 3 as a computing circuit 300 that delays a clock signal, embodiments of the invention encompass any type of digital circuit that delays any type of signal, including clock signals, command signals and non-command data signals.

Technical effects and benefits include providing delayed output signals that may be finely tuned and exhibit uniform delay steps. In particular, technical effects include providing a delay circuit capable of adjusting a main delay to a high resolution, such as in the picoseconds (ps) range, and providing highly uniform delay steps across process, voltage and temperature (PVT) corners.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or schematic diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As described above, embodiments can be embodied in the form of computer-implemented processes and apparatuses for practicing those processes. In embodiments, the invention is embodied in computer program code executed by one or more network elements. Embodiments include a computer program product on a computer usable medium with computer program code logic containing instructions embodied in tangible media as an article of manufacture. Exemplary articles of manufacture for computer usable medium may include floppy diskettes, CD-ROMs, hard drives, universal serial bus (USB) flash drives, or any other computer-readable storage medium, wherein, when the computer program code logic is loaded into and executed by a computer, the computer becomes an apparatus for practicing the invention. Embodiments include computer program code logic, for example, whether stored in a storage medium, loaded into and/or executed by a computer, or transmitted over some transmission medium, such as over electrical wiring or cabling, through fiber optics, or via electromagnetic radiation, wherein, when the computer program code logic is loaded into and executed by a computer, the computer becomes an apparatus for practicing the invention. When implemented on a general-purpose microprocessor, the computer program code logic segments configure the microprocessor to create specific logic circuits.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A delay circuit, comprising:
   at least one main inverter configured to receive an input signal and output a delayed output signal; and
   at least one switchable inverter connected in parallel with the at least one main inverter, the at least one switchable inverter configured to decrease a delay between the input signal and the delayed output signal based on the switchable inverter being turned on, the at least one main inverter including an even number of main inverters connected in series, the at least one switchable inverter including an even number of switchable inverters connected in series with each other, the even number of main inverters including a first main inverter and a second main inverter, the even number of switchable inverters including a first switchable inverter and a second switchable inverter, and the first switchable inverter connected in parallel with the first main inverter and the second switchable inverter connected in parallel with the second main inverter.

2. The delay circuit of claim 1, wherein the switchable inverter is larger than the main inverter.

3. The delay circuit of claim 1, wherein the switchable inverter is smaller than the main inverter.

4. The delay circuit of claim 1, wherein each of the switchable inverters connected in series with each other is turned on and off by a same control signal.

5. A delay circuit, comprising:
at least one main inverter configured to receive an input signal and output a delayed output signal; and
at least one switchable inverter connected in parallel with the at least one main inverter, the at least one switchable inverter configured to decrease a delay between the input signal and the delayed output signal based on the switchable inverter being turned on,
the at least one switchable inverter including
a first switchable inverter connected in parallel with the at least one main inverter and turned on and off by a first control signal, and
a second switchable inverter connected in parallel with the first switchable inverter and the at least one main inverter and turned on and off by a second control signal.

6. The delay circuit of claim 5, wherein the switchable inverter is larger than the main inverter.

7. The delay circuit of claim 5, wherein the switchable inverter is smaller than the main inverter.

8. The delay circuit of claim 5, wherein the first switchable inverter includes a first set of switchable inverters connected in series with each other and turned on and off by the same first control signal, and
the second switchable inverter includes a second set of switchable inverters connected in series with each other and turned on and off by the same second control signal, the second set of switchable inverters connected in parallel with the first set of switchable inverters.

9. The delay circuit of claim 8, wherein the at least one switchable inverter includes eight sets of switchable inverters, including the first and second sets of switchable inverters, each of the eight sets of switchable inverters turned on and off by a different bit of a control byte.

* * * * *